United States Patent [19]

Lee

[11] Patent Number: 5,266,510
[45] Date of Patent: Nov. 30, 1993

[54] HIGH PERFORMANCE SUB-MICRON P-CHANNEL TRANSISTOR WITH GERMANIUM IMPLANT

[75] Inventor: Ruojia Lee, Boise, Id.

[73] Assignee: Micron Technology, Inc., Boise, Id.

[21] Appl. No.: 566,433

[22] Filed: Aug. 9, 1990

[51] Int. Cl.[5] .......................................... H01L 21/336
[52] U.S. Cl. ...................................... 437/44; 437/24; 437/29; 437/45; 437/52
[58] Field of Search ...................... 437/24, 27, 28, 29, 437/30, 40, 41, 44, 45, 52

[56] References Cited

U.S. PATENT DOCUMENTS

| | | | |
|---|---|---|---|
| 4,352,236 | 10/1982 | McCollum | 437/47 |
| 4,366,613 | 1/1983 | Ogura et al. | 437/30 |
| 4,413,401 | 11/1983 | Klein et al. | 437/27 |
| 4,536,947 | 8/1985 | Bohr et al. | 437/57 |
| 4,617,066 | 10/1986 | Vasudev | 437/27 |
| 4,728,619 | 3/1988 | Pfiester et al. | 437/29 |
| 4,764,477 | 8/1988 | Chang et al. | 437/29 |
| 4,791,610 | 12/1988 | Takemae | 365/149 |
| 4,837,173 | 6/1989 | Alvis et al. | 437/44 |
| 5,141,882 | 8/1992 | Komori et al. | 437/45 |
| 5,145,794 | 9/1992 | Kase et al. | 437/24 |

FOREIGN PATENT DOCUMENTS 9005993 5/1990 World Int. Prop. O. ............ 437/44

OTHER PUBLICATIONS

Ozturk et al., "Optimization of the Germanium Preamorphization Conditions for Shallow-Junction Formation", IEEE Trans. on Electron Devices, vol. 35, No. 5, May 1988, pp. 659-668.

Pfiester et al., "Novel Germanium/Boron Channel-Stop Implantation for Submicron CMOS", IEDM 1987, pp. 740-743.

James R. Pfiester and John R. Alvis, "Improved CMOS Field Isolation Using Germanium/Boron Implantation", IEEE Electron Devices, vol. 9, No. 8, Aug. 1988, pp. 391-393.

James R. Pfiester et al., "Improved MOSFET Short--Channel Device Using Germanium Implantation", IEEE Electron Device Letters, vol. 9, No. 7, Jul. 1988, pp. 343-346.

Pfiester et al., "Anomalous Co-Diffusion Effects of Germanium on Group III and V Dopants", Appl. Phys. Lett., vol. 52, No. 6, Feb. 8, 1988, pp. 471-473.

Ng et al., "Suppression of Hot-Carrier Degradation in Si MOSFET's by Germanium Doping", IEEE Publication 0741-3106/90/0100-0045, Jan. 1990.

Primary Examiner—Mary Wilczewski
Attorney, Agent, or Firm—Stanley N. Protigal

[57] ABSTRACT

Implantation of germanium (45) into a PMOS buried channel to permits the enhancement implant profile (to 45) to be made more shallow. The shallow profile will reduce or eventually solve P-channel buried channel-induced short channel effects and enable further decrease in device length to deep submicron range.

Benefits include better short channel characteristics, i.e., higher punch through voltage BVDSS, less $V_T$ sensitivity to the drain voltage (defined as curl) and better subthreshold leakage characteristics.

11 Claims, 3 Drawing Sheets

HIGH PERFORMANCE SUB-MICRON P-CHANNEL TRANSISTOR WITH GERMANIUM IMPLANT

FIELD OF THE INVENTION

This invention is related to semiconductor devices. Specifically it is related to high-performance sub-micron channel length P-channel MOS (metal-oxide-semiconductor) transistor (PMOS for short) for the Very Large Scale Integrated (VLSI) or the Ultra Large Scale Integrated (ULSI) circuits. It employs the use of Germanium implant into the channel regions of transistors to both pre-amorphize the channel surface to alleviate the channelling of subsequent enhancement implant required by threshold voltage Vt adjustment and to retard the diffusion of the boron dopants (from enhancement implant) in the region to form a very shallow enhancement implant profile.

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

Shallow channel junction will reduce significantly the undesirable short channel effects of transistors. This is significant in the fabrication of sub-micron P-channel (P-CH) transistors in which n+ doped poly gate is used and buried channel is formed. It is desired to further reduce or even solve P-channel buried channel-induced short channel effects and enable further decrease in device length to the sub-micron range.

The prior art relating to Germanium in VLSI devices has been in the area of (1) field isolation improvement and (2) transistor source/drain regions to achieve shallow source and drain junctions. The former deals with device isolation and an improvement in electrical encroachment; yet it does not improve transistor performance; the later deals with device performance by means of achieving shallower source drain junction depths so that the reduction in charge-sharing effect would improve transistor short channel characteristics. It however does not solve or reduce P-channel transistor short channel effects caused by the very nature of buried channel behavior.

SUMMARY OF THE INVENTION

The present invention deals directly with PMOS buried channel characteristics by making the buried channel enhancement implant profile more shallow. The shallow implant profile results in the P-CH device will have less or no buried channel characteristics. This avoids undesirable short channel effects, and therefore permits further reduction in the transistor channel length.

The shallow profile causes surface channel characteristics to be dominant. Surface channel devices will have better short channel characteristics, i.e., higher punch through voltage BVDSS, less $V_T$ sensitivity to the drain voltage (defined as curl) and better subthreshold leakage characteristics.

Implantation of germanium into the channel to permit the enhancement implant profile to be made shallower will reduce or event solve P-channel buried channel-induced short channel effects and enable further decrease in device length to deep sub-micron range.

BRIEF DESCRIPTION OF THE DRAWINGS

The drawing Figures each show cross-sections of a portion of a semiconductor circuit device which utilizes the present invention.

DETAILED DESCRIPTION OF THE PREFERRED EMBODIMENT

Figure 1:
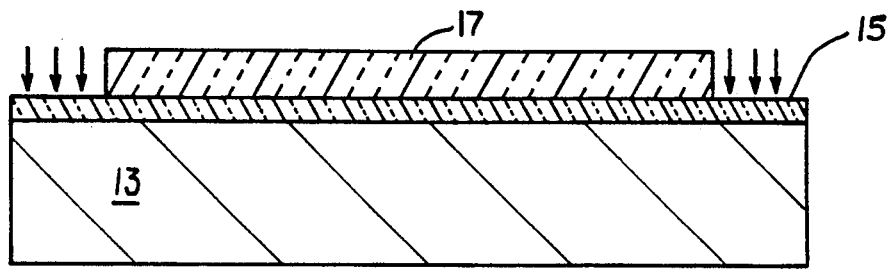
FIG. 1 shows growth of an initial gate oxide, patterning of active areas and channel stop implant.

FIG. 1 shows a cross-section of a semiconductor circuit during its fabrication. A silicon wafer 13 is prepared by forming a thin film of oxide 15 and then depositing nitride 17 over the thin oxide 15. The nitride is masked and etched in order to define active area (31, FIG. 3). The unmasked portions of the wafer 13 are then implanted with boron in order to increase parasitic field transistor threshold voltage $V_{TF}$.

Figure 2:
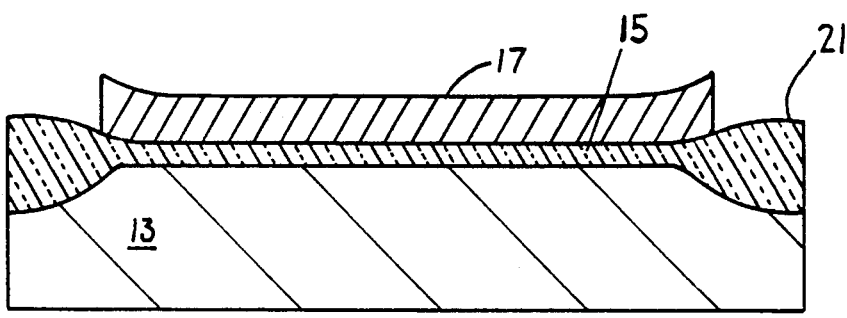
FIG. 2 shows a LOCOS step.

After the field implant, a thick layer of silicon oxide 21 is grown onto the wafer 13 to form field ox, as shown in FIG. 2. The growth of silicon oxide occurs in areas which are not covered by the nitride mask 17, but tends to encroach on the active area, marked AA. The encroachment is present around the edges of the nitride 17, as indicated by dashed lines 23, where the oxide 21 begins to "buck up" or lift the nitride 17.

Figure 3:
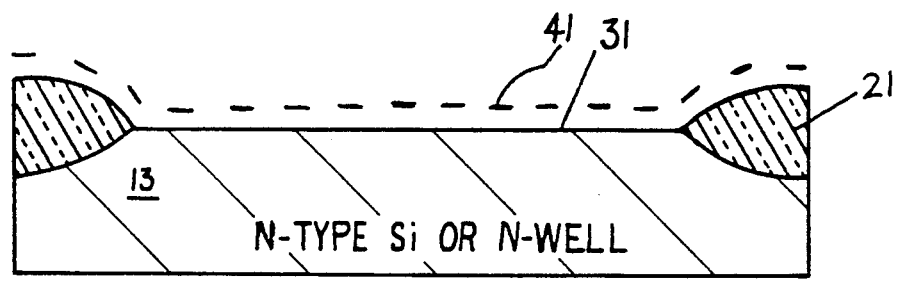
FIG. 3 shows nitride strip and initial oxide strip.

The nitride 17 is then stripped and the wafer 13 is oxide etched in order to remove a top portion 41 of the field ox 21, as shown in FIG. 3. This reduces the encroachment of the silicon oxide 21 into the active area 31 by reducing the thickness of the field oxide 21 in the regions of encroachment. This stripping of the top layer, referred to as dilute buffered hydrofluoric acid wet oxide etch, is timed to remove a pre-determined fraction of the field oxide.

The reduced thickness of the field oxide 21 adjacent to the active area 31 establishes an active parasitic MOS transistor device in the completed wafer. This parasitic MOS transistor device could result in shunting between adjacent active areas 31.

Figure 4:
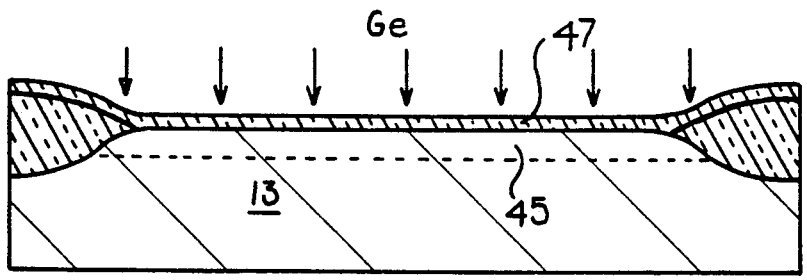
FIG. 4 shows growth of sacrificial oxide and germanium implant.
Figure 5:
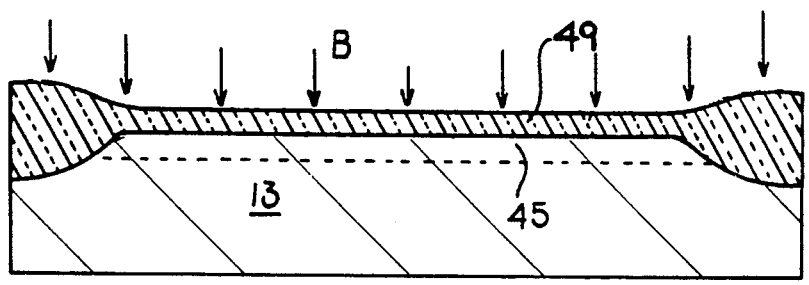
FIG. 5 shows $V_T$ enhancement implant and sacrificial oxide strip.
Figure 6:
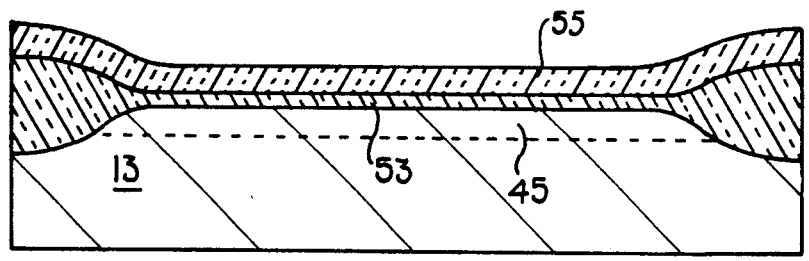
FIG. 6 shows final gate oxide growth, gate polysilicon deposition and phosphorus deposition.

At this point, a germanium implant is applied to the wafer by ion implantation, as shown in FIG. 4. Any of various sources of germanium may be used, such as $GeF_4$ gas. A preferred method for implanting the germanium is by ion implantation.

The germanium does not pass through the thick fieldox 21, but does penetrate the wafer 13 where the oxide 41 has been stripped (shown in FIG. 3). The germanium is allowed to penetrate to a level indicated by the dashed line by controlling implant energy, as well as other factors including temperature. This forms a germanium layer 45 to the depth of the dashed line.

The germanium layer 45 is used to reduce P-channel transistor buried channel effects by reducing counter-doping junction depth. A reduction in counter doping junction depths will, in turn, reduce short channel effects in the completed transistor. This also pre-amorphizes the channel surface in order to alleviate channeling of subsequent enhancement implant with boron.

FIG. 4 also shows the addition of a sacrificial layer 47 of oxide which is grown on to the wafer 13 after the germanium implant. Subsequent to the growth of the sacrificial layer, a boron implant is applied. The boron is able to penetrate the thin sacrificial layer 47 in order to permit control of $V_T$ of the transistors. The boron dopants diffuse into the wafer 13, but this diffusion remains very shallow as a result of the earlier implant of the germanium. This results in the germanium layer 45 being doped with the boron, and the infusion of the boron being largely confined to the germanium layer 45. After the boron implant, the sacrificial oxide 47 is stripped and a final gate oxide 49 is grown to improve gate oxide quality.

$BF_2$ may be used instead of boron in the boron implant steps in order to provide the boron implant.

A layer of polysilicon 55 is applied to the substrate 13 and, as a result of the final gate oxide 53, remains isolated from the boron doped germanium implant layer 45. This layer of polysilicon 55 forms the gates to transistors formed with the boron doped germanium layer 45, so that the boron doped germanium layer 45 forms source and drain regions. At that point, phosphorus deposition is applied to establish the polysilicon layer 55 as N+ type polysilicon.

Figure 7:
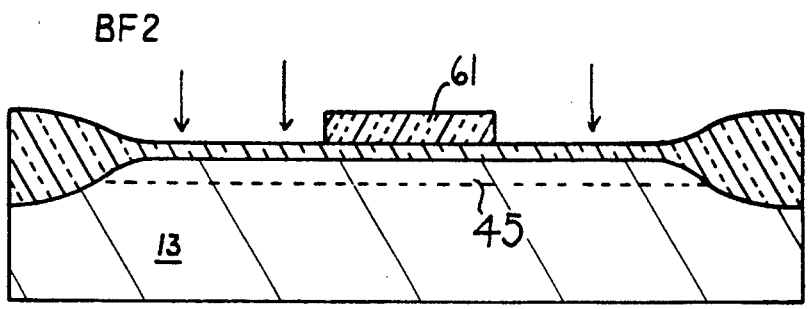
FIG. 7 shows transistor gate definition and lightly doped source/drain $BF_2$ implant.

The wafer is masked in order to define the transistor gate. As shown in FIG. 7, the definition of the transistor gates is accomplished by etching the N+ polysilicon in order to form gate portions 61 of the transistors. After the transistor gate definition, a lightly doped source and drain implant is applied by using $BF_2$ as an implant material. This results in a lightly doped source drain profile 63 as shown in FIG. 8.

Figure 8:
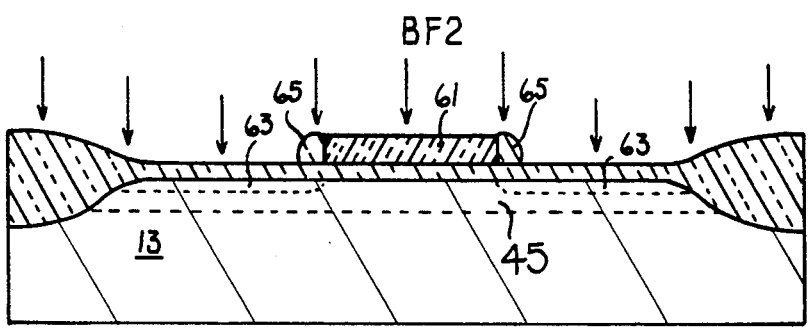
FIG. 8 shows spacer formation and heavy source/drain $BF_2$ implant.
Figure 9:
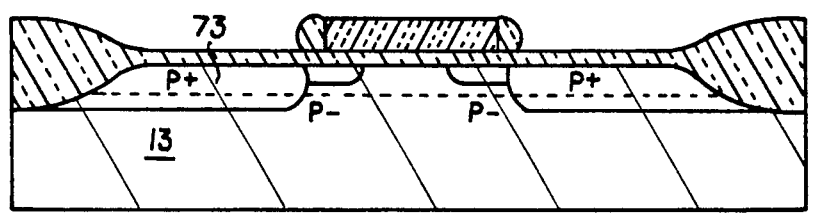
FIG. 9 shows source/drain activation.

Also as shown in FIG. 8, a spacer oxide 65 is grown from the transistor gate 61, followed by a heavy source/drain $BF_2$ implant. The heavy source/drain $BF_2$ implant results in the profile 73 of P+ areas shown in FIG. 9. The germanium implant earlier also reduces the diffusion of both P+ and P− and makes it possible to have shallower P+ and P− junctions.

The basic fabrication process flow of the inventive P-channel MOS transistor is as follows:
(1) grow initial gate oxide
(2) pattern active area, channel stop implant, LOCOS, nitride strip
(3) initial oxide strip
(4) sacrificial oxide grow
(5) germanium implant
(6) $V_T$ enhancement implant
(7) sacrificial oxide strip
(8) final gate oxide grow, gate polysilicon deposition and phosphorus deposition
(9) transistor gate definition
(10) lightly doped source/drain $BF_2$ implant
(11) spacer formation and heavy source/drain $BF_2$ implant
(12) source/drain activation In the preferred embodiment, one would implant N-type bottom plate capacitors at a does sufficient to significantly compensate the threshold voltage implant sufficiently to insure a desired bottom plate junction formation. The capacitor would include a grounded field plate. It is also possible to include a $V_{CC}/2$ field plate.

While the invention is described in terms of DRAMs, this is merely the preferred embodiment for which the inventive techniques were developed. Pertinent examples are EPROMs, video random access memories (VRAMs), other multiport RAMs, and other semiconductor devices.

For example, heavy germanium impurity in the N-channel devices can increase impact ionization rate and therefore make it easier to program in EPROMs by avalanching hot electrons.

Clearly, other steps may be taken within the scope of the invention in order to accomplish either same or different circuit results. Accordingly, the invention should be read only as limited by the claims.

We claim:

1. Method of forming semiconductor circuit devices which include, as a part of each device, a plurality of cells, said cells including active circuit elements, including p channel transistors, to control signals, the method comprising:
    a) preparing a silicon wafer and establishing the wafer as a substrate, and forming an oxide layer on the substrate;
    b) forming a nitride layer on the wafer to define field oxide and active areas;
    c) forming a pattern of nitride from said nitride layer over selected portions of the active areas;
    d) implanting the oxide layer adjacent the nitride pattern with an implant dopant which functions as a channel stop for isolating parasitic field effect transistors;
    e) growing oxide on the substrate around the nitride pattern, using LOCOS techniques;
    f) removing the nitride pattern;
    g) removing a portion of the oxide such that a fraction of the oxide in active areas formerly under the nitride pattern is removed, said removed portion defining channels for p channel transistors;
    h) implanting germanium into said channel areas of the substrate through the active areas from which a fraction of the oxide has been removed;
    i) growing further oxide over the germanium-implanted wafer;
    j) implanting boron through said further oxide;
    k) stripping said further oxide;
    l) growing a gate oxide layer over the active areas;
    m) depositing a first conductive layer over the gate oxide layer and etching the conductive layer to leave conductive material from the conductive layer in a gate pattern;
    n) implanting lightly doped source/drain regions around the gate pattern;
    o) forming oxide spacers adjacent to the conductive material in the gate pattern; and
    p) implanting source and drain impurities to form P+ source and drain regions adjacent to the gate pattern, separated by P− regions immediately adjacent to the gate pattern.

2. Method of forming semiconductor devices as described in claim 1, further characterized by:
    prior to said implanting of source and drain impurities to form the P+ source and drain regions, growing a spacer oxide from the conductive material in the gate pattern.

3. Method of forming semiconductor memory devices as described in claim 1, further characterized by:
   a) said fraction of oxide removed being greater than 50% of the thickness of the field oxide; and
   b) said implanting the wafer with boron at an implantation dose being performed subsequent to formation of the active areas and prior to said depositing of the first conductive layer.

4. Method of forming semiconductor memory devices as described in claim 3, further characterized by:
   forming each of said semiconductor memory devices with a grounded field plate.

5. Method of forming semiconductor circuit memory devices which include, as a part of each device, a plurality of memory cells and active circuit elements to control signals, the cells and active circuit elements forming a repeating pattern on the device, the method comprising:
   a) preparing a wafer and establishing the wafer as a substrate;
   b) forming oxide on the wafer to define field oxide and active areas, the active areas including active areas of p channel transistors;
   c) implanting germanium into transistor channel areas of the active areas of the p channel transistors;
   d) implanting the wafer with a P-type impurity which effects a change in a threshold voltage of the p channel transistors;
   e) forming gate electrodes; and
   f) implanting to form an N-type bottom plate capacitor with a dose sufficient to compensate the threshold voltage implant sufficiently to insure a desired bottom plate junction formation.

6. Method of forming semiconductor memory devices as described in claim 5, further characterized by:
   implanting source and drain impurities to form P+ source and drain regions adjacent to the gate electrodes, separated by P− regions immediately adjacent to the gate electrodes.

7. Method of forming semiconductor devices as described in claim 6, further characterized by:
   prior to implanting the source and drain impurities to form the P+ source and drain regions, growing a spacer oxide adjacent to the gate electrodes.

8. Method of forming semiconductor devices as described in claim 5, further characterized by:
   a) etching said defined regions of field oxide to be reduced in thickness to remove a fraction of field oxide present; and
   b) implanting the wafer with boron as the threshold voltage implant wherein the boron is implanted at energy levels which are optimized for penetration through the field oxide remaining after said etching of said defined regions of field oxide to be reduced in thickness.

9. Method of forming semiconductor memory devices as described in claim 1 or 4, further characterized by:
   isotropically etching the field oxide by application of a wet oxide etch to remove said fraction of the field oxide, by using dilute buffered hydrofluoric acid wet oxide etch as said oxide etch.

10. Method of forming semiconductor memory devices as described in claim 1 or 4, further characterized by:
    said fraction of oxide removed being greater than 50% of the thickness of the field oxide.

11. Method of forming semiconductor memory devices as described in claim 1 or 5, further characterized by:
    forming each of said semiconductor memory devices with a grounded field plate.

* * * * *